United States Patent
Shu

(10) Patent No.: US 6,842,227 B2
(45) Date of Patent: Jan. 11, 2005

(54) FUSION ATTACHMENT OF RIGID PELLICLES AND/OR FRAMES

(75) Inventor: Emily Yixie Shu, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/383,017

(22) Filed: Mar. 6, 2003

(65) Prior Publication Data

US 2004/0175962 A1 Sep. 9, 2004

(51) Int. Cl.[7] ............... G03B 27/62; G03F 9/00; A47G 1/12
(52) U.S. Cl. ............... 355/75; 428/14; 430/5
(58) Field of Search ............... 355/75, 53, 72; 250/239; 359/629; 428/14, 220; 430/5

(56) References Cited

U.S. PATENT DOCUMENTS 5,723,860 A * 3/1998 Hamada et al. ............. 250/239

2002/0004126 A1 * 1/2002 Honda et al. ............... 428/220
2002/0098420 A1 * 7/2002 Eynon ........................... 430/5
2003/0095245 A1 * 5/2003 Mishiro et al. ............... 355/75

OTHER PUBLICATIONS

Micro Lithography, Inc. web site. http://www.mliusa.com/products.htm#top.*

* cited by examiner

*Primary Examiner*—Peter B. Kim
(74) *Attorney, Agent, or Firm*—Michael D. Plimier

(57) ABSTRACT

A rigid pellicle, used to protect a patterned reticle from contamination in a lithographic process in the manufacture of integrated circuits, is attached to a mounting frame by fusing the pellicle and frame together. In one embodiment, an infrared laser beam is used to produce the fusion along the seam between the pellicle and the frame. The frame may also be attached to the reticle through a similar fusion process. In one embodiment, the pellicle, frame, and reticle are all comprised of fused silica.

24 Claims, 6 Drawing Sheets

FUSION ATTACHMENT OF RIGID PELLICLES AND/OR FRAMES

BACKGROUND

1. Technical Field

An embodiment of the invention relates generally to integrated circuit processing equipment, and in particular relates to the attachment of pellicles used in integrated circuit processing.

2. Description of the Related Art

Patterned reticles are used during the manufacture of integrated circuits to expose the surface layer (i.e., the top layer at that stage of manufacturing) of the wafer to a precision pattern of electromagnetic radiation (e.g., ultraviolet light of a particular wavelength). The exposure pattern at the surface layer may require tolerances of a few nanometers or less. Although the reticle pattern is typically much larger than the exposure pattern (the pattern is optically reduced before being focused on the wafer), particles of dust and other tiny bits of contamination on the reticle may cause fatal defects in the exposure pattern at the surface layer. Pellicles are used to prevent this problem by keeping the reticle pattern clean. A pellicle is a layer of effectively transparent material, mounted on a frame, that covers the patterned side of the reticle and seals off that side from contamination. Although the dust may still collect on the outside surface of the pellicle, it is far enough removed from the reticle pattern to be out of focus during the exposure operation, and therefore does not cause image defects. However, since the light must by necessity travel through the pellicle, the pellicle itself must have a minimal effect on the direction of travel of the light. Distortion of the pellicle from its desired flat shape may cause the direction of the light traveling through the pellicle to be affected, and thus affect the quality of the focused image.

Conventional pellicles are made of polymer film attached to a frame with adhesive, and the frame is then attached to the reticle, also with adhesive. The mechanical forces involved in this adhesive attachment process may be as high as 27,000 kilograms per square meter ($kg/m^2$), which may cause the pellicle to be distorted from its desired shape (which would ideally be completely flat). The thinness of conventional polymer films (typically <1 micron thick) minimizes any resultant distortion in the image. However, the use of shorter wavelength lithography, such as 157 nm, has brought about the use of thicker, rigid pellicles made of materials such as fused silica. These rigid pellicles may be from 300 to 1,000 microns thick, and the effects on the focused image of distortion from the pellicle may be significant. The mechanical forces of adhesive attachment can introduce unacceptable distortion in the pellicle, thereby degrading the focused image and making the final image quality unacceptable.

BRIEF DESCRIPTION OF THE DRAWINGS

The invention may be understood by referring to the following description and accompanying drawings that are used to illustrate embodiments of the invention. The drawing are not to scale. Any relative dimensions as shown in the drawings are simply for clarity of illustration, and should not be interpreted as a limitation on the relative dimensions of actual physical elements. In the drawings.

DETAILED DESCRIPTION OF THE INVENTION

Figure 1:
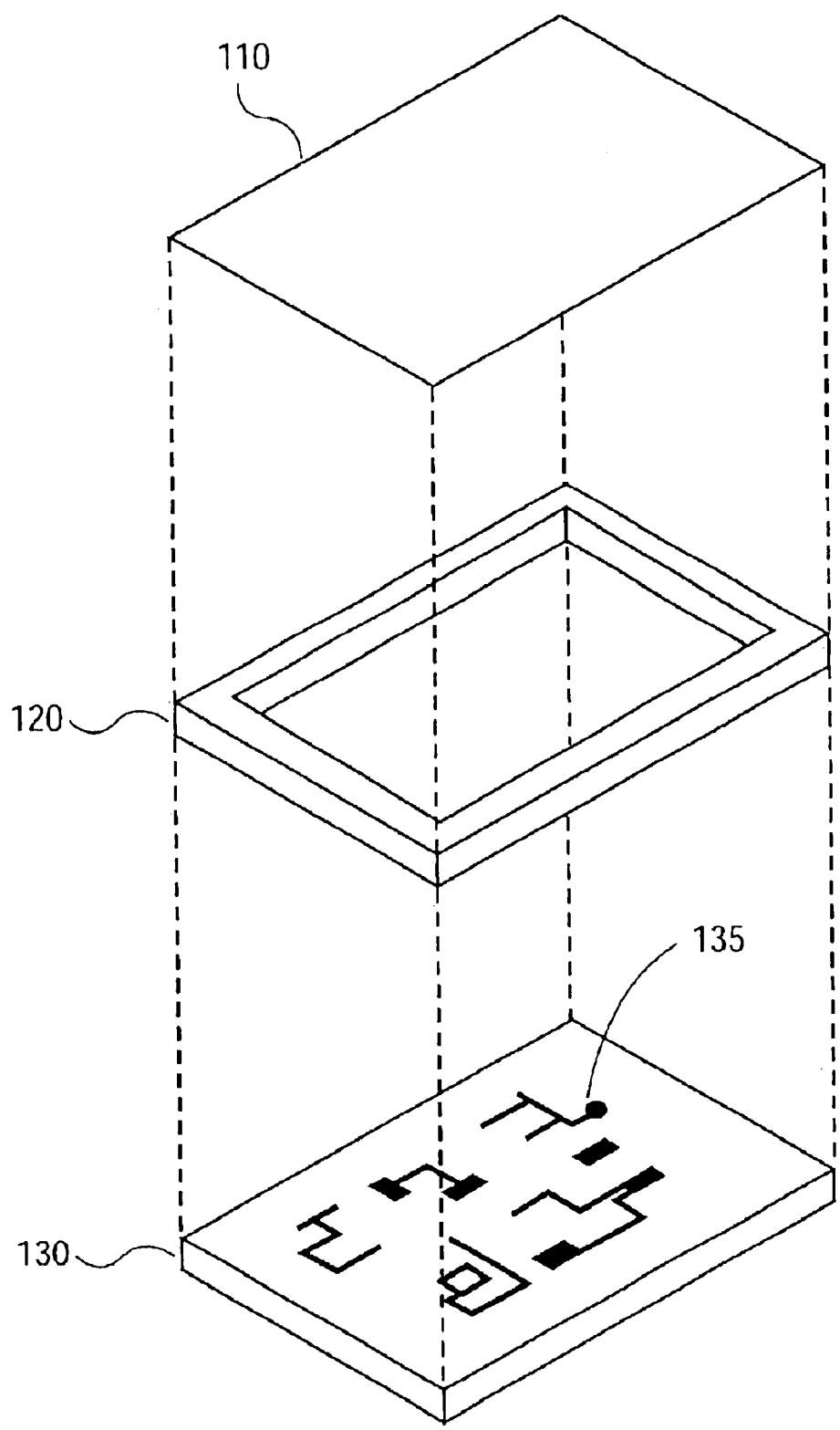
FIG. 1 shows an exploded view of a pellicle-frame-reticle assembly, according to one embodiment of the invention.

In the following description, numerous specific details are set forth. However, it is understood that embodiments of the invention may be practiced without these specific details. In other instances, well-known materials, structures and techniques have not been shown in detail in order not to obscure an understanding of this description.

References to "one embodiment", "an embodiment", "example embodiment", "various embodiments", etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

Any reference to "up", "down", "right", "left", "top" or "bottom" refer to the orientation of illustrated elements as shown in the drawings, not necessarily to the orientation of actual physical elements relative to gravity.

Various embodiments of the invention may use laser-induced fusion, or another localized melting process that doesn't require mechanical pressure, to connect a pellicle to a frame, and/or to attach the frame to a reticle, thereby avoiding the mechanical forces that are inherent in an adhesive-based attachment technique. Without those mechanical forces, distortion of the pellicle introduced by the attachment process may be eliminated or greatly reduced as compared with conventional assembly techniques.

FIG. 1 shows an exploded view of a pellicle-frame-reticle (PFR) assembly, according to one embodiment of the invention. Alternately, FIG. 1 may be interpreted as showing the pellicle 110, frame 120, and reticle 130 separately before assembly. Note that no adhesive or other separate mechanical fastening mechanisms are shown. A pattern 135 is shown on the top surface of reticle 130. In one embodiment, the reticle is used in a lithographic exposure operation in the manufacture of integrated circuits. The particular pattern shown is merely for illustrative purposes and may not be representative of an actual pattern. On an actual reticle, the individual lines and other shapes in the pattern may be much more numerous and may be too small to be seen at the scale of FIG. 1.

Figure 2:
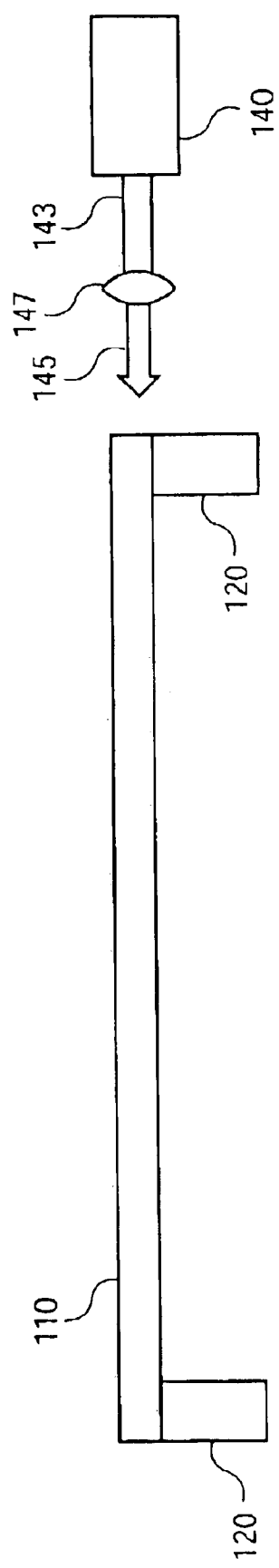
FIG. 2 shows a cross-section of the pellicle and frame in position for attachment to one another, according to one embodiment of the invention.

FIG. 2 shows a cross-section of the pellicle and frame in position for attachment to one another, according to one embodiment of the invention. The pellicle 110 is shown in contact with the frame 120. In one embodiment pellicle 110 is comprised of fused silica, but other embodiments may use a pellicle comprised of other materials. In one embodiment frame 120 is comprised of fused silica, but other embodiments may use a frame comprised of other materials. FIG. 2 also shows a laser 140 producing a beam 143 of light that is focused by an optical lens 147 to produce a focused beam 145 of light. In a particular embodiment, laser 140 is a $CO_2$ laser producing infrared light with a wavelength of approximately 10.6 microns, but other embodiments involving lasers may use other types of lasers and/or may produce light with other wavelengths. Although the described embodiments involve a laser, other embodiments may use sources of electromagnetic radiation other than a laser, and may use a focusing system other than an optical lens to focus the electromagnetic radiation (e.g., a multi-lens system, a non-optical focusing device, etc.)

The focused beam 145 may be directed to the seam where the pellicle 110 and the frame 120 meet. As the energy from the focused beam 145 is absorbed by the material of the pellicle 110 and frame 120 at that location, the heat generated by that absorption may cause the material of the pellicle 110 and the material of the frame 120 to melt and fuse together, so that the two materials form a single solid substance when they cool and re-crystallize. In some embodiments, the entire circumferential seam of the interface between pellicle 110 and frame 120 is fused together in this manner, providing a continuous seal along what was once a contact interface between two objects. In one embodiment, the pellicle-frame assembly is rotated such that the seam is passed through the focused beam 145 of a stationary laser 140. In another embodiment, the pellicle-frame assembly remains stationary while the laser 140 is moved around it or the optical system is adjusted to move the beam. In a third embodiment, multiple lasers 140 are used to fuse different parts of the pellicle-frame assembly together. Some or all of these embodiments may also be combined in any manner.

In a particular embodiment, the energy concentration of the focused beam at the seam of the PF assembly is up to approximately 400 joules per cubic millimeter with a fusing depth of between one and 10 millimeters, the fusing speed is approximately 100–500 millimeters per minute along the seam, and the material of the pellicle at the seam is heated to a melting temperature of approximately 1713 degrees Celsius, but other embodiments may use other values for any of these parameters. Acceptable values for these parameters may depend on various factors, such as the wavelength of light being used, the absorption rate of the pellicle and/or frame materials at this wavelength, the melting temperature of the material, etc.

The depth to which fusion needs to be achieved may depend on various factors, such as the mechanical strength needed to hold the pellicle and frame together, the variation in the depth of fusion due to operating tolerances, the amount of heat transferred beyond the fusion joint and into the more central areas of the pellicle and the resulting effect on pellicle distortion, the permissible time allowed for the fused areas to solidify, etc.

Figure 3:
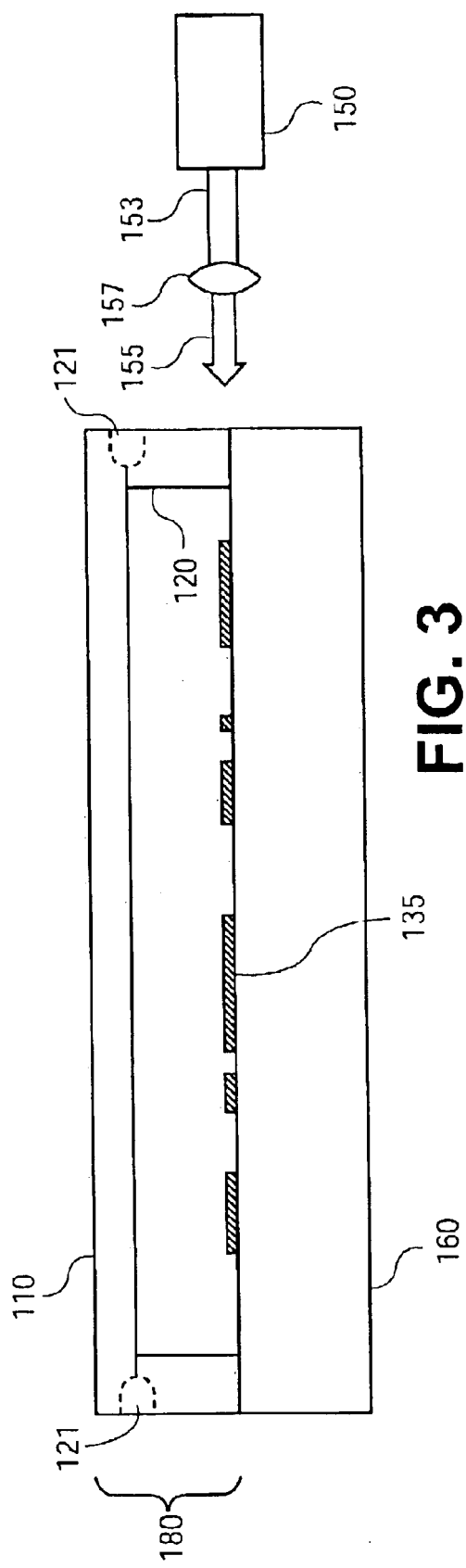
FIG. 3 shows a cross-section of a fused pellicle-frame assembly and a reticle in position for attachment to one another, according to one embodiment of the invention.

FIG. 3 shows a cross-section of a fused pellicle-frame (PF) assembly and a reticle in position for attachment to one another, according to one embodiment of the invention. The frame of PF assembly 180 is shown in contact with reticle 160, with the material of pattern 135 disposed on the side of the reticle 160 that faces the pellicle 110. In one embodiment the pattern 135 has a thickness of approximately 100 nanometers (nm), but other embodiments may have other thicknesses. As previously stated, the portions of pattern 135 shown in the figures are for illustrative purposes only—a real pattern may be composed of many elements too small to be distinguishable in the drawings.

The PF assembly 180 may have a fused area 121 in which the material of pellicle 110 and the material of frame 120 have been fused together and cooled into to a solid form. In one embodiment the fused area 121 forms a continuous area around the circumference of the PF assembly 180. Although shown with a hemispherical cross section, the fused area 121 may have a cross section of any feasible shape. The shape may depend on various factors, such as the absorption rate of the light by the material, the thermal conductiveness of the material, the laser power, the focal area and depth, etc. In one embodiment, there is no physical difference between the material of pellicle 110, the material of frame 120 and the material of fused area 121 after cooling—they are all the same material with the same characteristics. In another embodiment the material may undergo a permanent change during the fusion process, so that the fused area 121 of the finished product is physically and/or chemically different than the surrounding material. In still another embodiment, the material of pellicle 110 is different than the material of frame 120, and the fused area 121 may comprise a combination of the two materials.

FIG. 3 also shows a laser 150 producing a beam 153 of light, which is focused by lens 157 into focused beam 155. Although the described embodiment involves a laser, other embodiments may use sources of electromagnetic radiation other than a laser, and may use a focusing system other than an optical lens to focus the electromagnetic radiation (e.g., a multi-lens system, a non-optical focusing device, etc.) The focused beam 155 is shown directed at the seam between the frame 120 and the reticle 160. In one embodiment laser 150 is the same laser used to fuse the pellicle to the frame, but in other embodiments a separate laser may be used.

The focused beam 155 may be directed to the seam where the frame 120 and the reticle 160 meet. As the energy from the focused beam 155 is absorbed by the material of the frame 120 and reticle 160 at that location, the heat generated by that absorption may cause the material of the frame 120 and the material of the reticle 160 to soften and fuse together. In some embodiments, the entire circumferential seam of the interface between the frame 120 and the reticle 160 is fused together in this manner, providing a continuous seal along what was once a contact interface between two objects. In one embodiment the pellicle-frame-reticle assembly is rotated such that the frame-reticle seam is passed through the focused beam 155 of a stationary laser 150. In another embodiment the pellicle-frame-reticle assembly remains stationary while the laser 140 is moved around it or the optical system is adjusted to move the beam. In a third embodiment, multiple lasers 150 are used to fuse different parts of the frame and reticle together. Some or all of these embodiments may also be combined in any feasible manner.

In a particular embodiment, the energy concentration of the focused beam at the frame-reticle assembly is up to approximately 400 joules per cubic millimeter with a fusing depth of between one and 10 millimeters, the fusing speed is approximately 100–500 millimeters per minute along the seam, and the material of the pellicle at the seam is heated to a melting temperature of approximately 1713 degrees Celsius, but other embodiments may use other values for any of these parameters. Acceptable values for these parameters may depend on various factors, such as wavelength of light being used, the absorption rate of the material at this wavelength, the melting temperature of the material, etc.

The depth to which fusion needs to be achieved may also depend on various factors, such as the mechanical strength needed to hold the frame and reticle together, the variation in the depth of fusion that results from operating tolerances, the amount of heat transferred beyond the fusion joint and into the more central areas of the reticle and the resulting effect on reticle distortion, the permissible time allowed for the fused areas to solidify, etc. In one embodiment the attachment area of the reticle is free of all material (e.g., the material of the pattern mask) other than fused silica. This clearance area may be achieved through the lithographic process that created the pattern mask on the reticle.

Figure 4:
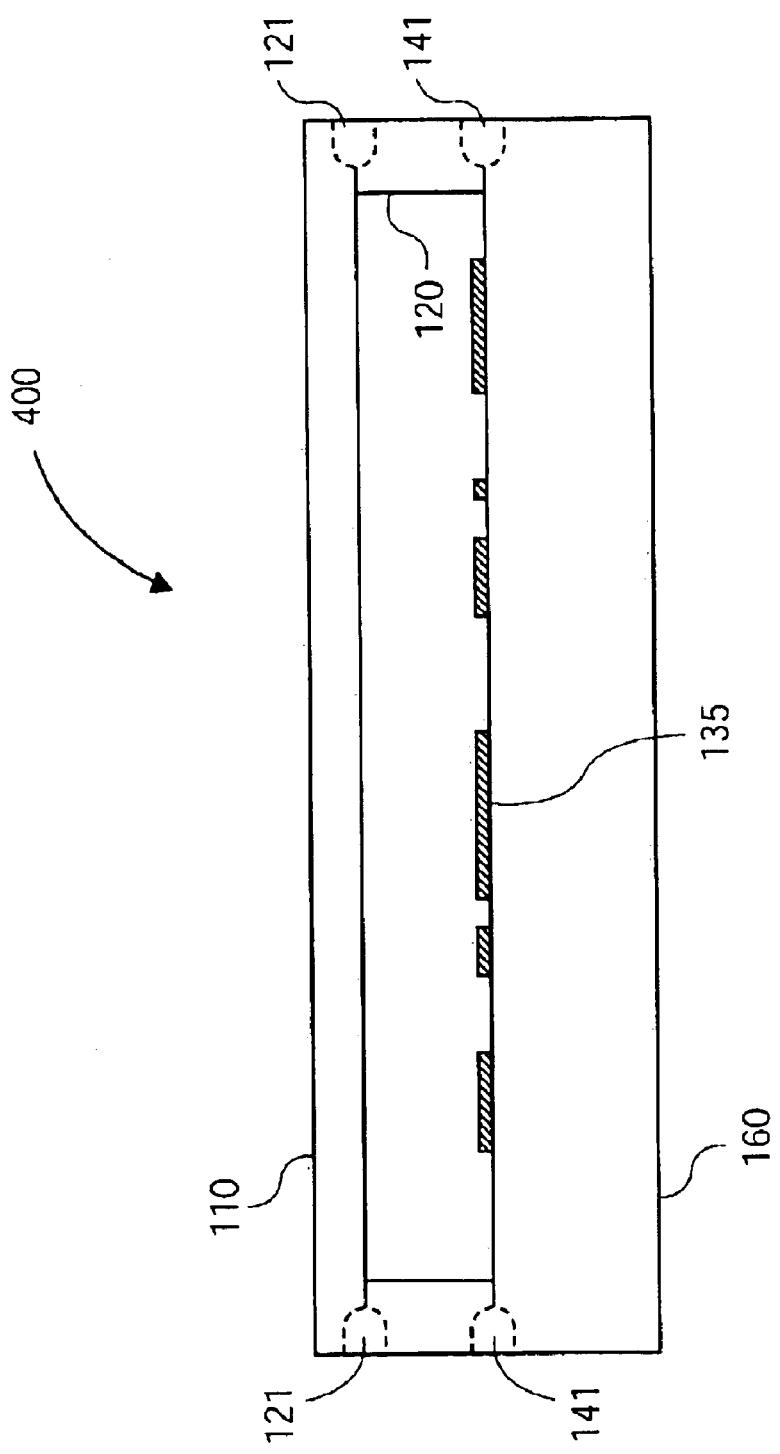
FIG. 4 shows a completed pellicle-frame-reticle assembly, according to one embodiment of the invention.

FIG. 4 shows a completed pellicle-frame-reticle (PFR) assembly, according to one embodiment of the invention. The PFR assembly 400 may have a fused area 141 in which the material of frame 120 and the material of reticle 160 have been fused together and cooled into to a solid form. In one embodiment the fused area 141 is a continuous area around the circumference of the PFR assembly 400. Although shown with a hemispherical cross section, the fused area 141 may have a cross section with any feasible shape. The shape may depend on various factors, such as the absorption rate of the light by the material, the thermal conductiveness of the material, the laser power, the focal area and depth, etc. In one embodiment, there is no physical difference between the material of frame 120, the material of reticle 160, and the material of fused area 141 after cooling—they are all the same material with the same characteristics. In another embodiment the material may undergo a permanent change during the fusion process, so that the fused area 141 of the finished product is physically and/or chemically different than the surrounding material. In still another embodiment, the material of frame 120 is different than the material of reticle 160, and the fused area 141 comprises a combination of the two materials.

Distortion of the pellicle in the completed PFR assembly 400 may be measured in various ways. In one embodiment the local tilt of the pellicle within a circular area of about 2 millimeters diameter (the deviation, at any given point within a localized 2 millimeter circle, from theoretical overall perfect flatness) is no more than approximately 10 micro radians. In one embodiment the perpendicular distance from any given point on the pellicle to the plane of a theoretically perfect pellicle is no more than approximately 1 micron.

Figure 5:
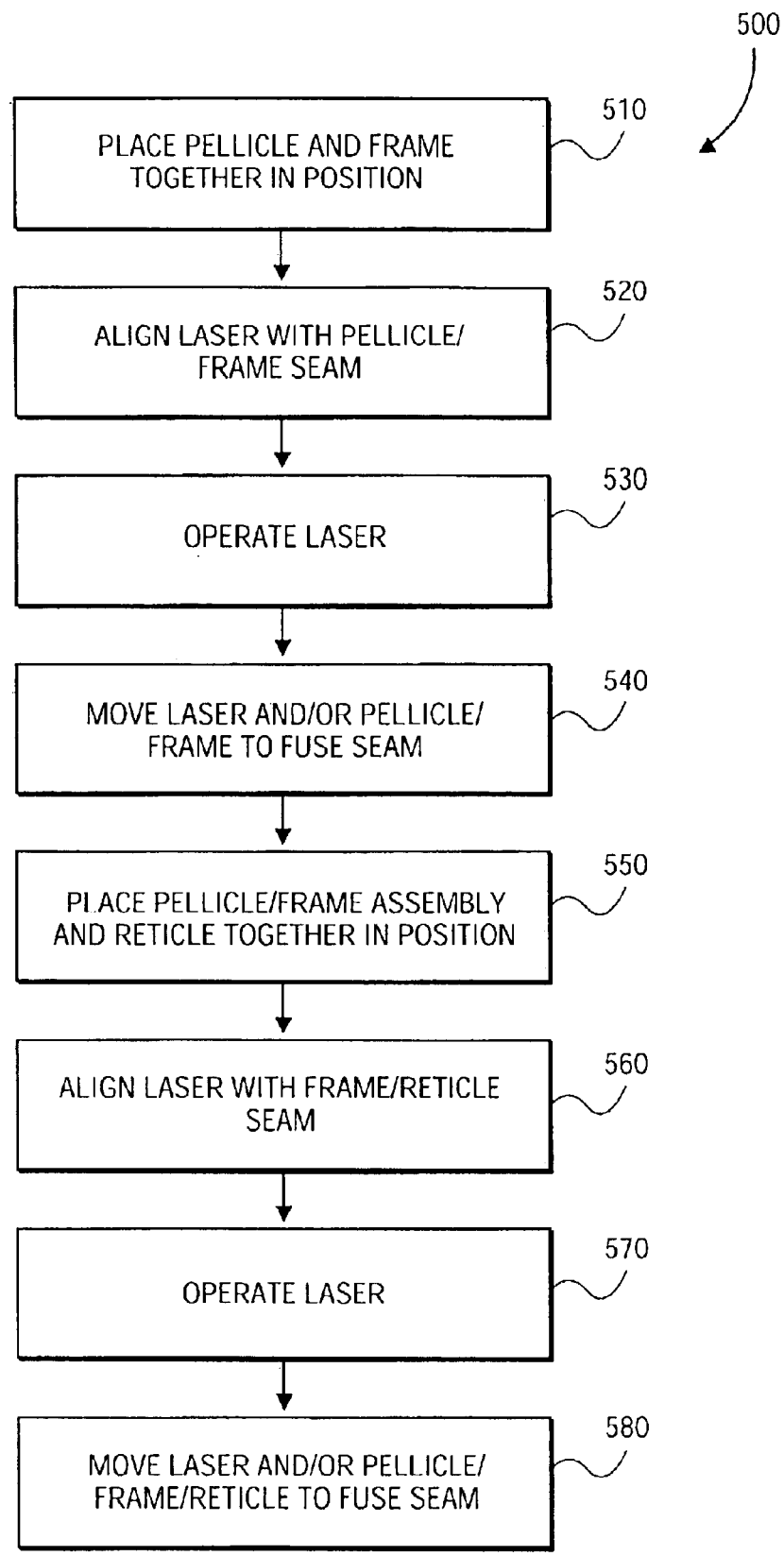
FIG. 5 shows a flow chart of a method of joining a pellicle, frame, and reticle, according to one embodiment of the invention.

FIG. 5 shows a flow chart of a method of joining a pellicle, frame, and reticle, according to one embodiment of the invention. Referring to flow chart 500, at 510 a pellicle and a frame are placed together in the position in which they are to be joined together. At 520 a source of electromagnetic radiation, such as an infrared laser, is aligned with the pellicle-frame combination so that a focused laser beam will be directed at some point along the seam between the pellicle and the frame. At 530 the laser is turned on. At 540 the laser and the pellicle-frame combination are moved relative to one another, so that the focused laser beam will move along the seam. Either the laser, the pellicle-frame assembly, or both may be physically moved to achieve this relative movement. The movement may be controlled so that any given point along the seam receives sufficient laser light to fuse the two parts (the pellicle and the frame) together at that point.

After the pellicle and frame are fused in this manner, the pellicle-frame assembly may next go through another operation (not shown) such as testing for distortion in the pellicle resulting from mounting and/or handling. Some pellicle-frame assemblies may be discarded if they fail such testing. Whether such a testing operation is needed may depend on how reliably the fusing and handling operations can be performed without having a significant effect on such distortion.

At 550 the reticle and the pellicle-frame assembly may be placed in the position in which they are to be joined together. At 560 a laser is aligned with the pellicle-frame-reticle combination so that a focused laser beam will be directed at some point along the seam between the frame and the reticle. At 570 the laser is turned on. At 580 the laser and the pellicle-frame-reticle combination are moved relative to one another, so that the focused laser beam will be directed at some point along the seam between the frame and the reticle. Either the laser, the pellicle-frame-reticle assembly, or both may be physically moved to achieve this relative movement. As previously described, the movement may be controlled so that any given point along the seam receives sufficient laser light to fuse the two parts (the frame and the reticle) together at that point.

In the aforementioned manner, the pellicle, frame, and reticle may be fused together so that the space between the pellicle and the reticle is sealed off from outside contamination. The entire assembly process may take place in a clean environment so that contaminating particles will not be trapped within this space. Since adhesive is not used, there is no danger of outgassing particles from the adhesive entering the sealed space, and the only mechanical forces on the parts during the assembly process may be the forces needed to hold the parts in place during the fusing operation. In one embodiment gravity is the only force used to hold the parts together before fusion.

The method embodiment described above has the pellicle attached to the frame first, and then the frame is attached to the reticle. Another embodiment may reverse this process, and have the frame attached to the reticle before the pellicle is attached to the frame. Still another embodiment may hold all three parts together at the same time and fuse both seams approximately concurrently, using at least two focused laser beams.

In one embodiment a single laser beam is used to perform the fusing operation on a seam. In another embodiment, multiple laser beams may be used to perform the fusing operation at multiple points concurrently on the seam. When multiple laser beams are used, one embodiment may use multiple lasers, each producing a single focused laser beam, while another embodiment may use an optical splitter and/or mirror system to produce multiple laser beams from a single laser.

Figure 6:
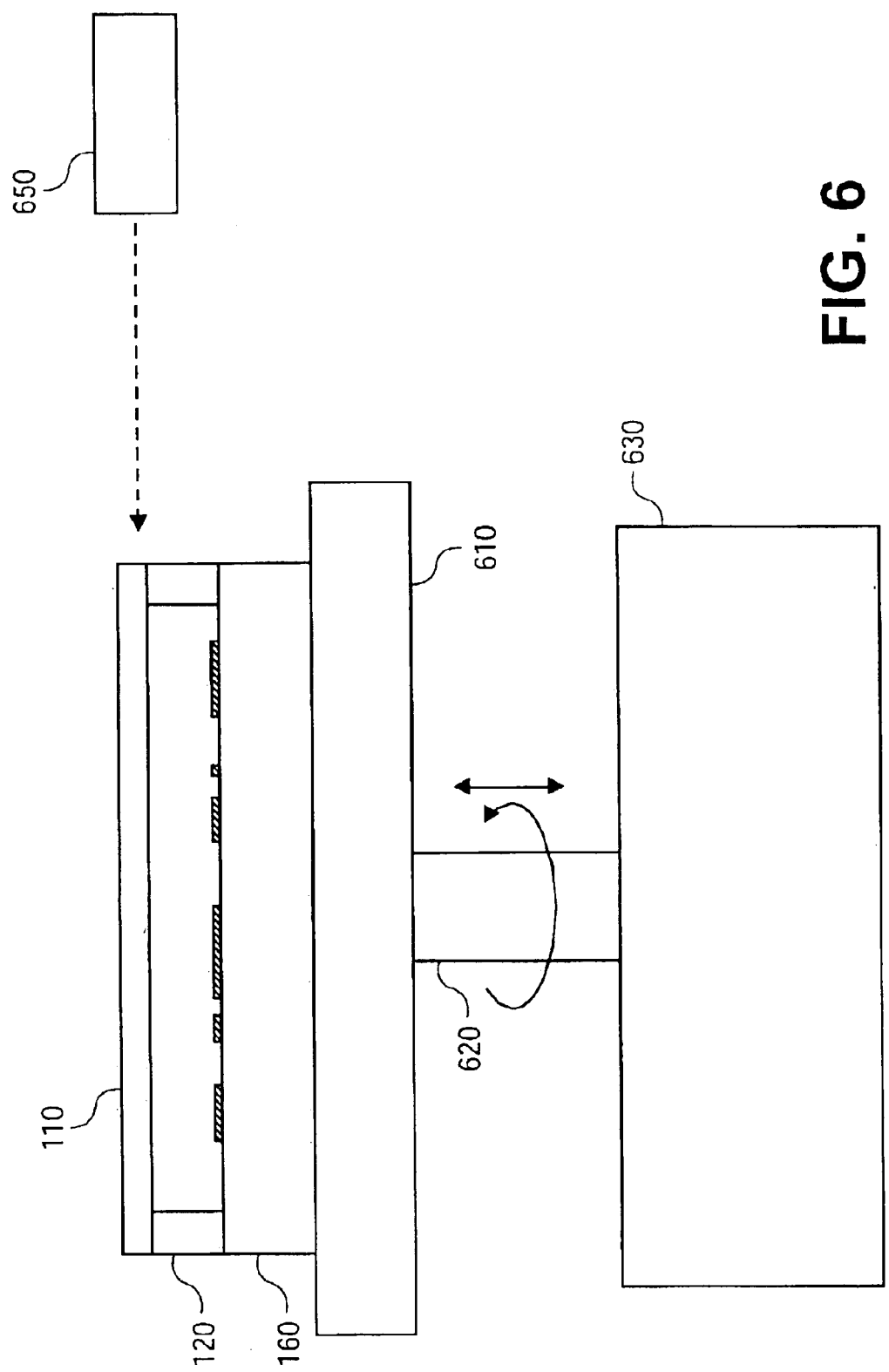
FIG. 6 shows a system for fusing a pellicle to a frame and a frame to a reticle, according to one embodiment of the invention.

FIG. 6 shows a system for fusing a pellicle to a frame and a frame to a reticle, according to one embodiment of the invention. FIG. 6 shows a side view of the pellicle 110, frame 120, and reticle 160 resting in position on a support in the form of a platform 610. The platform 610 is mounted on a structure in the form of a shaft 620 that can be rotated, raised and lowered by control device 630. Laser device 650 may be a laser, an optical system for focusing a laser beam, or both. In the illustrated embodiment, laser device 650 is fixed in position, while platform 610 may be raised and lowered so that the focused laser beam from laser device 650 is directed to either the seam between pellicle 110 and frame 120, or to the seam between frame 120 and reticle 160. Once a seam is in the path of the laser beam, platform 610 (and therefore the PFR assembly on top of it) may be rotated so that the entire circumference of the seam is exposed to the laser beam, thereby fusing the frame to either the pellicle or to the reticle along the entire circumference of the seam. Although the illustrated embodiment shows the PFR assembly being supported by a simple rotating platform, other embodiments may use other techniques to support the assembly and to direct the laser beam to the seam. Although the illustrated embodiment shows the platform being moved up and down to achieve alignment between the laser beam and the selected seam of the PFR assembly, other embodiments may use other techniques to achieve alignment. Although the illustrated embodiment shows the entire PFR assembly being placed together before any fusing takes place, other embodiments may omit either the reticle or the pellicle from the platform during a particular operation.

The foregoing description is intended to be illustrative and not limiting. Variations will occur to those of skill in the art. Those variations are intended to be included in the various embodiments of the invention, which are limited only by the spirit and scope of the appended claims.

What is claimed is:

1. An apparatus, comprising:
   a pellicle fused to a frame by at least one fused pellicle-frame portion;
   a reticle attached to the frame; and
   wherein at least a portion of the fused pellicle-frame portion does not include an adhesive that bonds the pellicle to the frame.

2. The apparatus of claim 1, wherein:
   the reticle is to be used in a lithographic exposure operation in manufacturing integrated circuits.

3. The apparatus of claim 1, wherein:
   the pellicle comprises fused silica.

4. The apparatus of claim 3, wherein:
   the frame comprises fused silica.

5. The apparatus of claim 1, wherein:
   the pellicle is fused to the frame along a seam between the pellicle and the frame.

6. The apparatus of claim 1, wherein:
   the pellicle fused to the frame that is attached to the reticle has a local tilt of less than 10 microradians.

7. The apparatus of claim 1, wherein the pellicle is not bonded to the frame with an adhesive.

8. The apparatus of claim 1, wherein the pellicle and frame each have a melting point above about 1700 degrees Celsius.

9. The apparatus of claim 1, wherein the at least one fused pellicle-frame portion comprises a fused area around at least a portion of a circumference of the fused pellicle and frame.

10. The apparatus of claim 9, wherein the at least one fused pellicle-frame portion comprises a continuous fused area around the circumference of the fused pellicle and frame.

11. The apparatus of claim 9, wherein the pellicle, the frame, and the at least one fused pellicle-frame portion all consist of substantially the same material.

12. The apparatus of claim 1, wherein the pellicle fused to the frame that is attached to the reticle has a perpendicular distance from any point on a surface the pellicle to a plane of a theoretically perfectly planar pellicle that is no more than about 1 micron.

13. An apparatus, comprising:
    a pellicle fused to a frame; and
    a reticle attached to the frame; and
    wherein the reticle is fused to the frame.

14. The apparatus of claim 13, wherein:
    the reticle comprises fused silica.

15. The apparatus of claim 14, wherein:
    the frame comprises fused silica.

16. The apparatus of claim 15, wherein the pellicle comprises fused silica.

17. An apparatus, comprising:
    a pellicle comprising a first material;
    a frame comprising a second material; and
    a fused portion to bond the pellicle to the frame, the fused portion comprising a portion of the first material of the pellicle fused with a portion of the second material of the frame.

18. The apparatus of claim 17, wherein both the first material and the second material are the same material.

19. The apparatus of claim 18, wherein both the first material and the second material are fused silicon.

20. The apparatus of claim 18, the fused portion consists of the first material fused with the second material.

21. The apparatus of claim 17, wherein a portion of a surface of the pellicle is in contact with a portion of a surface of the frame and the portion of the surface of the pellicle is not fused to the portion of the surface of the frame.

22. The apparatus of claim 17, wherein the portion of the surface of the pellicle in contact with the portion of the surface of the frame is adjacent the fused portion to bond the pellicle to the frame.

23. The apparatus of claim 17, wherein no adhesive bonds the pellicle to the frame.

24. The apparatus of claim 17, wherein the fused portion comprises a portion of the pellicle fused with a portion of the frame.

* * * * *